US010707409B2

(12) United States Patent
Kuo et al.

(10) Patent No.: US 10,707,409 B2
(45) Date of Patent: Jul. 7, 2020

(54) TECHNIQUES FOR FORMING SPIN-TRANSFER TORQUE MEMORY HAVING A DOT-CONTACTED FREE MAGNETIC LAYER

(71) Applicant: INTEL CORPORATION, Santa Clara, CA (US)

(72) Inventors: Charles C. Kuo, Hillsboro, OR (US);
Kaan Oguz, Beaverton, OR (US);
Brian S. Doyle, Portland, OR (US);
Mark L. Doczy, Portland, OR (US);
David L. Kencke, Beaverton, OR (US);
Satyarth Suri, Hillsboro, OR (US);
Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/882,546

(22) Filed: Jan. 29, 2018

(65) Prior Publication Data

US 2018/0166625 A1    Jun. 14, 2018

Related U.S. Application Data

(63) Continuation of application No. 15/117,605, filed as application No. PCT/US2014/032138 on Mar. 28, 2014, now Pat. No. 9,882,121.

(51) Int. Cl.
*H01L 43/08* (2006.01)
*H01L 43/02* (2006.01)
(Continued)

(52) U.S. Cl.
CPC .......... *H01L 43/08* (2013.01); *G11C 11/161* (2013.01); *H01L 43/02* (2013.01); *H01L 43/12* (2013.01)

(58) Field of Classification Search
CPC ....... G11C 11/161; H01L 43/02; H01L 43/08; H01L 43/12
See application file for complete search history.

(56) References Cited

U.S. PATENT DOCUMENTS 6,897,532 B1   5/2005  Schwarz et al.
7,855,085 B2  12/2010  Drewes et al.
(Continued)

FOREIGN PATENT DOCUMENTS

WO   2007008251 A2    1/2007
WO   2015147855 A1   10/2015

OTHER PUBLICATIONS

International Search Report and Written Opinion as received for Patent Application No. PCT/US2014/032138, dated Dec. 12, 2014. 12 pages.

(Continued)

*Primary Examiner* — Jamie C Niesz
(74) *Attorney, Agent, or Firm* — Finch & Maloney PLLC

(57) ABSTRACT

Techniques are disclosed for fabricating a self-aligned spin-transfer torque memory (STTM) device with a dot-contacted free magnetic layer. In some embodiments, the disclosed STTM device includes a first dielectric spacer covering sidewalls of an electrically conductive hardmask layer that is patterned to provide an electronic contact for the STTM's free magnetic layer. The hardmask contact can be narrower than the free magnetic layer. The first dielectric spacer can be utilized in patterning the STTM's fixed magnetic layer. In some embodiments, the STTM further includes an optional second dielectric spacer covering sidewalls of its free magnetic layer. The second dielectric spacer can be utilized in patterning the STTM's fixed magnetic layer and may serve, at least in part, to protect the sidewalls of the free magnetic layer from redepositing of etch byproducts during such (Continued)

patterning, thereby preventing electrical shorting between the fixed magnetic layer and the free magnetic layer.

20 Claims, 4 Drawing Sheets

(51) Int. Cl.
  *G11C 11/16* (2006.01)
  *H01L 43/12* (2006.01)

(56) References Cited

U.S. PATENT DOCUMENTS

| | | | |
|---|---|---|---|
| 9,172,033 B2 | 10/2015 | Sung et al. | |
| 9,882,121 B2 | 1/2018 | Kuo et al. | |
| 2004/0127054 A1* | 7/2004 | Lee | H01L 21/32139 438/712 |
| 2008/0211055 A1 | 9/2008 | Assefa et al. | |
| 2010/0065935 A1 | 3/2010 | Horng et al. | |
| 2010/0240151 A1 | 9/2010 | Belen et al. | |
| 2010/0276768 A1* | 11/2010 | Gaidis | H01L 43/08 257/421 |
| 2011/0169112 A1* | 7/2011 | Chen | B82Y 10/00 257/421 |
| 2011/0235217 A1 | 9/2011 | Chen et al. | |
| 2012/0040531 A1 | 2/2012 | Mao | |
| 2013/0001652 A1 | 1/2013 | Yoshikawa et al. | |
| 2013/0075845 A1 | 3/2013 | Chen et al. | |
| 2013/0119494 A1 | 5/2013 | Li et al. | |
| 2014/0167191 A1 | 6/2014 | Doyle et al. | |
| 2016/0268336 A1 | 9/2016 | Shum et al. | |
| 2016/0329488 A1 | 11/2016 | Li et al. | |
| 2016/0351238 A1 | 12/2016 | Doyle et al. | |
| 2016/0359101 A1 | 12/2016 | Kuo et al. | |

OTHER PUBLICATIONS

Office Action and Search Report received for TW Application No. 104104230, dated May 20, 2016. 15 pages; including 7 pages of English translation.

International Preliminary Report on Patentability as received for Patent Application No. PCT/US2014/032138, dated Oct. 13, 2016. 9 pages.

Extended European Search Report received for EP Application No. 14887032.2, dated Oct. 18, 2017. 6 pages.

\* cited by examiner

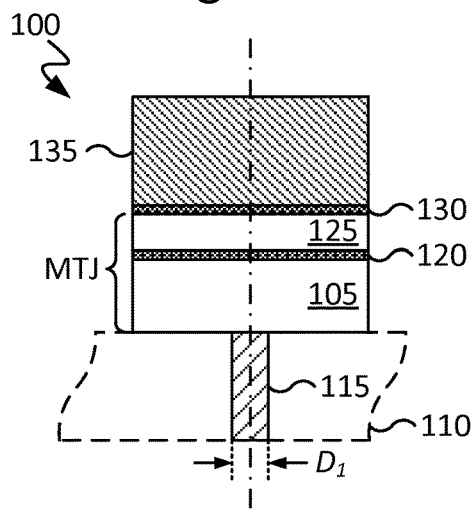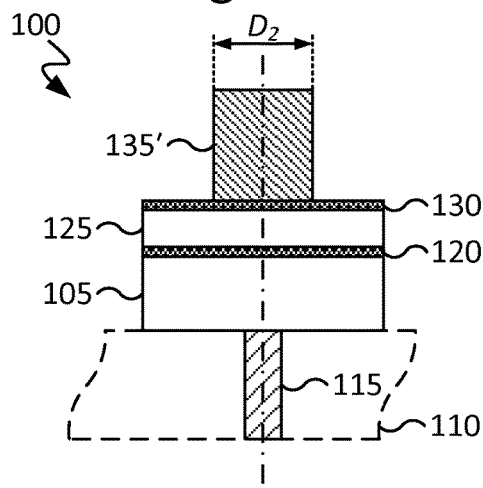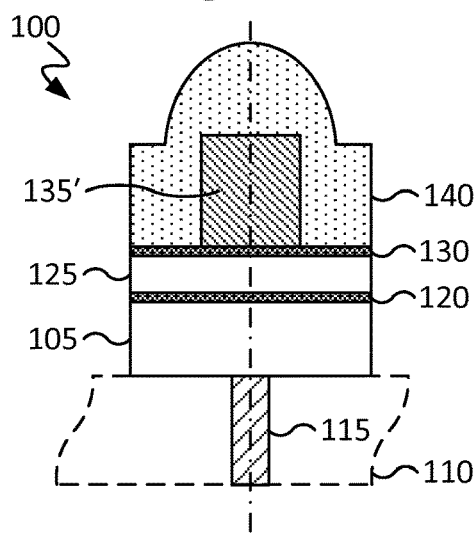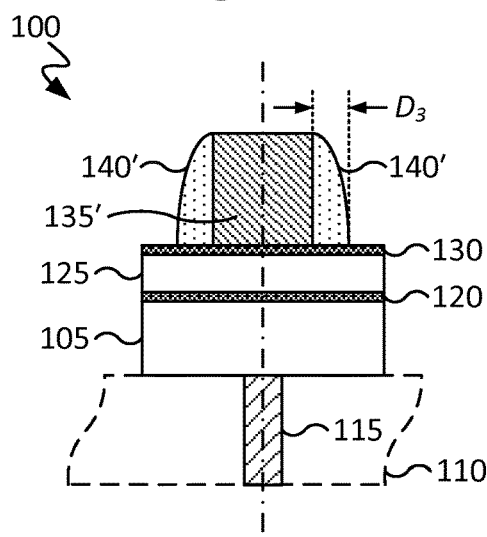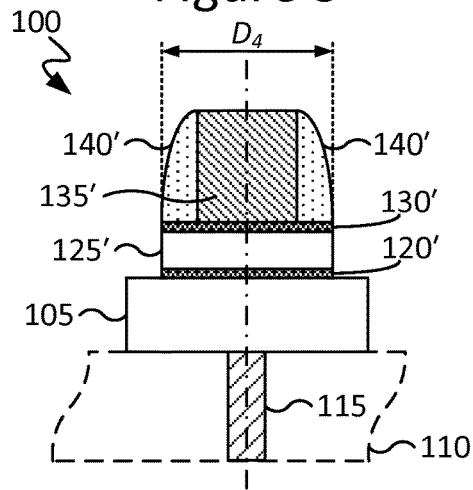

TECHNIQUES FOR FORMING SPIN-TRANSFER TORQUE MEMORY HAVING A DOT-CONTACTED FREE MAGNETIC LAYER

RELATED APPLICATIONS

This patent application is a continuation of U.S. application Ser. No. 15/117,605 filed Aug. 9, 2016, now U.S. Pat. No. 9,882,121, which is a U.S. National Stage Application of International Application No. PCT/US2014/032138 filed Mar. 28, 2014, both of which are herein incorporated by reference in their entirety.

BACKGROUND

A spin-transfer torque memory (STTM) is a type of magnetoresistive memory that can employ a magnetic tunnel junction (MTJ) device. A typical MTJ device configuration includes an oxide-based tunnel barrier layer sandwiched between a fixed magnetic layer and a free magnetic layer. The direction of magnetization in the fixed layer is normally maintained as a reference, and the direction of magnetization in the free layer is adjusted relative thereto. When the MTJ device is in its low resistivity state—that is, the directions of magnetization for the fixed and free layers are parallel with one another—electrons with spins oriented parallel to the magnetization (spin-up electrons) readily pass from the fixed magnetic layer through the tunnel barrier layer to the free magnetic layer, and electrons with spins oriented anti-parallel to the magnetization (spin-down electrons) are strongly scattered. Contrariwise, when the MTJ device is in its high resistivity state—that is, the directions of magnetization for the fixed and free layers are anti-parallel with one another—electrons of both types of spins (spin-up and spin-down electrons) are strongly scattered, and quantum tunneling through the tunnel barrier layer is suppressed. Thus, a STTM employing a MTJ device can be considered a programmable magnetoresistive memory, wherein a binary '0' can be stored in the MTJ device by changing its resistance to the low resistivity state and a binary '1' can be stored by changing its resistance to the high resistivity state. Within the context of a STTM, the free magnetic layer's direction of magnetization can be switched through spin-torque transfer using a spin-polarized current.

BRIEF DESCRIPTION OF THE DRAWINGS

FIG. 1 is a cross-sectional view of an integrated circuit (IC) configured in accordance with an embodiment of the present disclosure.

FIG. 2 is a cross-sectional view of the IC of FIG. 1 after patterning a hardmask layer, in accordance with an embodiment of the present disclosure.

FIG. 3 is a cross-sectional view of the IC of FIG. 2 after formation of a first spacer layer, in accordance with an embodiment of the present disclosure.

FIG. 4 is a cross-sectional view of the IC of FIG. 3 after patterning the first spacer layer, in accordance with an embodiment of the present disclosure.

FIG. 5 is a cross-sectional view of the IC of FIG. 4 after patterning the second insulator layer, the free magnetic layer, and the first insulator layer, in accordance with an embodiment of the present disclosure.

Figure 6A:
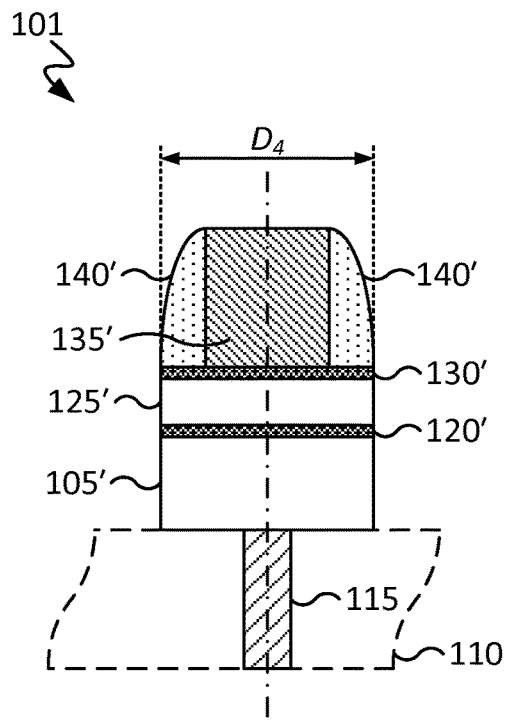
FIG. 6A is a cross-sectional view of the IC of FIG. 5 after patterning the fixed magnetic layer, in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines, right angles, etc., and some features may have surface topology or otherwise be non-smooth, given real world limitations of fabrication processes. In short, the figures are provided merely to show example structures.

DETAILED DESCRIPTION

Techniques are disclosed for fabricating a self-aligned spin-transfer torque memory (STTM) device with a dot-contacted free magnetic layer. In some embodiments, the disclosed STTM device includes a first dielectric spacer covering sidewalls of an electrically conductive hardmask layer that is patterned to provide an electronic contact for the STTM's free magnetic layer. In accordance with some embodiments, the hardmask contact can be formed so as to be narrower than the free magnetic layer and thus, in a general sense, may be considered a dot contact for the underlying free magnetic layer. Also, the first dielectric spacer can be utilized, in accordance with an embodiment, in patterning the STTM's fixed magnetic layer. In some embodiments, the STTM further includes an optional second dielectric spacer covering sidewalls of its free magnetic layer. The second dielectric spacer can be utilized, in accordance with an embodiment, in patterning the STTM's fixed magnetic layer and may serve, at least in part, to protect the sidewalls of the free magnetic layer from redepositing of etch byproducts during such patterning, thereby preventing electrical shorting between the fixed magnetic layer and the free magnetic layer. Numerous configurations and variations will be apparent in light of this disclosure.

General Overview

The current through a spin-transfer torque memory (STTM) bit is limited by the current coming out of the transistor in the one transistor-one memory element (e.g., 1T-1R) cell. As such, it is generally desirable to reduce the so-called critical current density necessary to switch the memory bit. To that end, the size of the memory element cell can be reduced. However, this also decreases the stability of such non-volatile memory. Continued process scaling will tend to worsen such complications.

Thus, and in accordance with some embodiments of the present disclosure, techniques are disclosed for fabricating a self-aligned spin-transfer torque memory (STTM) device with a dot-contacted free magnetic layer. In some embodiments, a STTM device configured as described herein includes a first dielectric spacer covering sidewalls of an electrically conductive hardmask layer that is patterned to provide an electronic contact for the STTM's free magnetic layer. In some such cases, the hardmask contact may have a width/diameter that is less than that of the free magnetic layer. Also, in accordance with an embodiment, the first dielectric spacer can be utilized in patterning the STTM's fixed magnetic layer. In some embodiments, the STTM further includes an optional second dielectric spacer covering sidewalls of its free magnetic layer. In such cases, the second dielectric spacer can be utilized in patterning the STTM's fixed magnetic layer and may serve, at least in part, to protect the sidewalls of the free magnetic layer from redepositing of residual etch byproducts during such patterning. Thus, in accordance with an embodiment, the second dielectric spacer can help to prevent electrical shorting between the fixed magnetic layer and the free magnetic layer.

In accordance with some embodiments, techniques disclosed herein can be utilized, for example, to reduce the so-called critical current utilized to switch a memory cell of given fixed dimension. As discussed herein, reducing the size of the STTM's contacts causes the local current density to increase, which in turn causes the memory cell itself to switch. Thus, in some instances, the disclosed techniques can be utilized, for example, to reduce contact size to provide small, scalable memory cells. Also, as discussed herein, the disclosed techniques can be utilized, in accordance with some embodiments, in formation of embedded and/or non-embedded non-volatile magnetoresistive memory structures. Numerous suitable uses and applications of the techniques and structures disclosed herein will be apparent in light of this disclosure. Furthermore, in some cases use of the disclosed techniques may be detected, for example, by visual or other inspection (e.g., scanning electron microscopy, or SEM; transmission electron microscopy, or TEM; etc.) of a given STTM device or other integrated circuit including one or more dielectric spacers and an electrically conductive hardmask dot-contact configured as described herein.

Methodologies and Structure

Figure 6B:
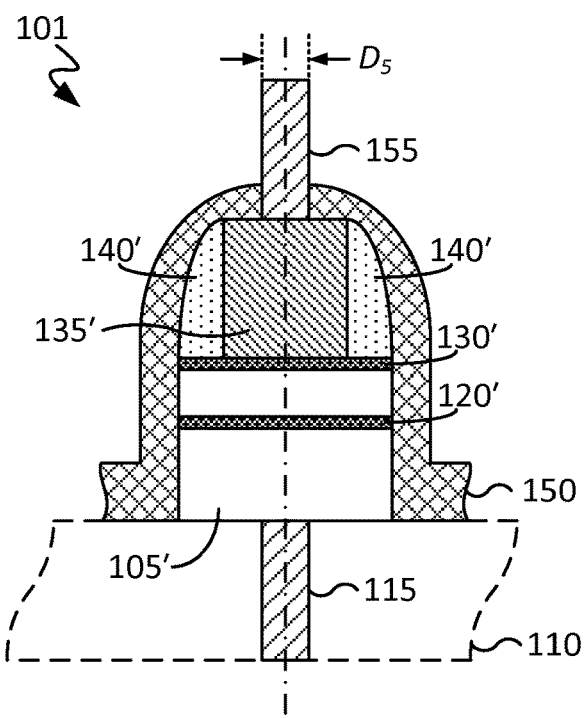
FIG. 6B is a cross-sectional view of the IC of FIG. 6A after formation of an encapsulation layer and upper interconnect, in accordance with an embodiment of the present disclosure.

FIGS. 1-5 illustrate an integrated circuit (IC) fabrication process flow, in accordance with an embodiment of the present disclosure. FIGS. 6A-6B illustrate additional optional processing of the IC 100 of FIG. 5 to provide an IC 101, in accordance with an embodiment of the present disclosure. FIGS. 7A-7D illustrate additional optional processing of the IC 100 of FIG. 5 to provide an IC 102, in accordance with another embodiment of the present disclosure.

The process may begin as in FIG. 1, which is a cross-sectional view of an IC 100 configured in accordance with an embodiment of the present disclosure. As can be seen, IC 100 initially may include a first magnetic layer 105, a first insulator layer 120, a second magnetic layer 125, a second insulator layer 130, and a hardmask layer 135, each of which is discussed in turn below. These layers of IC 100 may be stacked as generally shown over an interconnect 115 of an underlying metallized circuit layer 110, in accordance with some embodiments. The lower interconnect 115 can be formed from any suitable electrically conductive material (or combination of materials), as typically done. Some example materials for lower interconnect 115 include: copper (Cu); cobalt (Co); molybdenum (Mo); rhodium (Rh); beryllium (Be); chromium (Cr); manganese (Mn); aluminum (Al); silver (Ag); gold (Au); titanium (Ti); indium (In); ruthenium (Ru); palladium (Pd); tungsten (W); nickel (Ni); and/or a combination of any one or more thereof. Also, the dimensions of lower interconnect 115 can be customized, as desired for a given target application or end-use. For example, in some embodiments, lower interconnect 115 may have a width/diameter ($D_1$) in the range of about 0.1-100 nm (e.g., about 0.1-1 nm, about 1-25 nm, about 25-50 nm, about 50-75 nm, about 75-100 nm, or any other sub-range in the range of about 0.1-100 nm). Other suitable materials and configurations for lower interconnect 115 and underlying metallized circuit layer 110 will depend on a given application and will be apparent in light of this disclosure.

As will be appreciated in light of this disclosure, first magnetic layer 105 may be prevented from undergoing changes in its magnetization, and thus may be considered, in a general sense, as being a fixed or pinned magnetic layer. For consistency and ease of understanding of the present disclosure, first magnetic layer 105 hereinafter may be referred to as a fixed magnetic layer 105. Fixed magnetic layer 105 can have any of a wide range of configurations. For example, in accordance with some embodiments, fixed magnetic layer 105 may be formed from one or more layers including: iron (Fe); tantalum (Ta); ruthenium (Ru); cobalt (Co); a combination of one or more transition metals, such as cobalt-palladium (Co—Pd) or cobalt-platinum (Co—Pt); a combination of one or more transition metals and a metalloid, such as cobalt-iron-boron (CoFeB); and/or a combination of any one or more thereof. In accordance with some embodiments, fixed magnetic layer 105 may be formed as a multi-layered stack of films. For instance, in accordance with some embodiments, fixed magnetic layer 105 may be formed as a multi-layered stack including: a tantalum (Ta) or other conductive bottom electrode; a synthetic antiferromagnet (SAF) of cobalt-platinum (Co—Pt) alloy/ruthenium (Ru)/cobalt-platinum (Co—Pt) alloy; a tantalum (Ta) or other conductive metal spacer; and a cobalt-iron-boron (CoFeB) alloy or other suitable reference layer. In some other embodiments, fixed magnetic layer 105 alternatively may include cobalt-palladium (Co—Pd) within the SAF portion thereof. In some instances in which fixed magnetic layer 105 is configured as a multi-layered stack, some degree of intermixing may occur between constituent layers, for example, as a result of thermal annealing or other processing. In some cases, the constituent materials of a given portion of fixed magnetic layer 105 may be intentionally combined so as to provide an alloyed film; for instance, cobalt (Co), iron (Fe), and boron (B) may be sputtered together to provide a CoFeB alloy film. Other suitable materials and configurations for fixed magnetic layer 105 will depend on a given application and will be apparent in light of this disclosure.

Also, fixed magnetic layer 105 can be formed using any of a wide range of techniques. For example, fixed magnetic layer 105 may be formed, in accordance with some embodiments, using: a physical vapor deposition (PVD) process, such as sputter deposition; a chemical vapor deposition (CVD) process; and/or a molecular beam epitaxy (MBE) process. Furthermore, the dimensions of fixed magnetic layer 105 can be customized as desired for a given target application or end-use. For example, in some embodiments, fixed magnetic layer 105 may have a thickness in the range of about 1-100 Å (e.g., about 1-25 Å, about 25-50 Å, about 50-75 Å, about 75-100 Å, or any other sub-range in the range of about 1-100 Å). In some cases, fixed magnetic layer 105 may have a thickness of a monolayer of its one or more constituent materials. In some instances, fixed magnetic layer 105 may have a substantially uniform thickness over the topography provided, for example, by any underlying layers of IC 100 (e.g., metallized layer 110 and/or lower interconnect 115). In some instances, fixed magnetic layer 105 may be provided as a substantially conformal layer over such topography. In some other instances, fixed magnetic layer 105 may be provided with a non-uniform or otherwise varying thickness over such topography. For example, in some cases a first portion of fixed magnetic layer 105 may have a thickness within a first range while a second portion thereof has a thickness within a second, different range. Other suitable dimensions and techniques for forming fixed magnetic layer 105 will depend on a given application and will be apparent in light of this disclosure.

First insulator layer 120 can be formed from any suitable electrically insulating material (or combination of such materials), using any of a wide range of techniques. For example, in some cases, first insulator layer 120 may be formed from an electrically conductive oxide, such as magnesium oxide (MgO). In accordance with some embodiments, first insulator layer 120 may be formed, for example, using: a physical vapor deposition (PVD) process, such as sputter deposition; a chemical vapor deposition (CVD) process; and/or a molecular beam epitaxy (MBE) process. Other suitable materials and techniques for forming first insulator layer 120 will depend on a given application and will be apparent in light of this disclosure.

Furthermore, the dimensions of first insulator layer 120 can be customized as desired for a given target application or end-use. For example, in some embodiments, first insulator layer 120 may have a thickness in the range of about 1-100 Å (e.g., about 1-25 Å, about 25-50 Å, about 50-75 Å, about 75-100 Å, or any other sub-range in the range of about 1-100 Å). In some cases, first insulator layer 120 may have a thickness of a monolayer of its one or more constituent materials. In accordance with some embodiments, the thickness of first insulator layer 120 may be selected or otherwise tuned such that fixed magnetic layer 105 and second magnetic layer 125 are sufficiently insulated from one another while still allowing electrons to pass there between via quantum tunneling through first insulator layer 120. Thus, in a sense, first insulator layer 120 may serve, at least in part, as a spin filter for the MTJ of IC 100. In some instances, first insulator layer 120 may have a substantially uniform thickness over the topography provided, for example, by any underlying layers of IC 100 (e.g., fixed magnetic layer 105). In some instances, first insulator layer 120 may be provided as a substantially conformal layer over such topography. In some other instances, first insulator layer 120 may be provided with a non-uniform or otherwise varying thickness over such topography. For example, in some cases a first portion of first insulator layer 120 may have a thickness within a first range while a second portion thereof has a thickness within a second, different range. In some cases, first insulator layer 120 may be formed from multiple layers of the same or different materials (e.g., an insulator material and a non-insulator material). Other suitable dimensions for first insulator layer 120 will depend on a given application and will be apparent in light of this disclosure.

As will be appreciated in light of this disclosure, free magnetic layer 125 can be formed from any of the example magnetic materials discussed above, for instance, with respect to fixed magnetic layer 105, in accordance with some embodiments. In some example cases, free magnetic layer 125 may be formed as a single layer of CoFeB or a multi-layer stack of CoFeB/Ta/CoFeB. Also, as will be appreciated, free magnetic layer 125 may be permitted to undergo changes in its magnetization, and thus may be considered, in a general sense, as being a free or dynamic magnetic layer. For consistency and ease of understanding of the present disclosure, free magnetic layer 125 hereinafter may be referred to as a free magnetic layer 125. As will be further appreciated, free magnetic layer 125 can be formed over IC 100 using any of the example formation techniques discussed above with reference to fixed magnetic layer 105, in accordance with some embodiments. Other suitable materials and techniques for forming free magnetic layer 125 will depend on a given application and will be apparent in light of this disclosure.

Furthermore, the dimensions of free magnetic layer 125 can be customized as desired for a given target application or end-use. For example, in some embodiments, free magnetic layer 125 may have a thickness in the range of about 1-100 Å (e.g., about 1-25 Å, about 25-50 Å, about 50-75 Å, about 75-100 Å, or any other sub-range in the range of about 1-100 Å). In some cases, free magnetic layer 125 may have a thickness of a monolayer of its one or more constituent materials. In some instances, free magnetic layer 125 may have a substantially uniform thickness over the topography provided, for example, by any underlying layers of IC 100 (e.g., first insulator layer 120). In some instances, free magnetic layer 125 may be provided as a substantially conformal layer over such topography. In some other instances, free magnetic layer 125 may be provided with a non-uniform or otherwise varying thickness over such topography. For example, in some cases a first portion of free magnetic layer 125 may have a thickness within a first range while a second portion thereof has a thickness within a second, different range. Other suitable dimensions for free magnetic layer 125 will depend on a given application and will be apparent in light of this disclosure.

Second insulator layer 130 can be formed from any of a wide range of materials. For example, in accordance with some embodiments, second insulator layer 130 may be formed from an electrically conductive oxide, such as magnesium oxide (MgO), tantalum oxide ($Ta_2O_5$), aluminum oxide ($Al_2O_3$), and/or a combination of any one or more thereof. Also, as will be appreciated in light of this disclosure, second insulator layer 130 can be formed over IC 100 using any of the example formation techniques discussed above with reference to first insulator layer 120, in accordance with some embodiments. In some instances, second insulator layer 130 can be formed over IC 100 using an atomic layer deposition (ALD) process. Other suitable materials and techniques for forming second insulator layer 130 will depend on a given application and will be apparent in light of this disclosure.

Furthermore, the dimensions of second insulator layer 130 can be customized as desired for a given target application or end-use. In some embodiments, second insulator layer 130 may have a thickness in one or more of the example ranges discussed above, for instance, with respect to first insulator layer 120. In some embodiments, second insulator layer 130 may have a thickness that is substantially equivalent to (e.g., exactly equal to or otherwise within a given tolerance of) the thickness of first insulator layer 120. In some cases, second insulator layer 130 may have a thickness of a monolayer of its one or more constituent materials. In some instances, second insulator layer 130 may have a substantially uniform thickness over the topography provided, for example, by any underlying layers of IC 100 (e.g., free magnetic layer 125). In some instances, second insulator layer 130 may be provided as a substantially conformal layer over such topography. In some other instances, second insulator layer 130 may be provided with a non-uniform or otherwise varying thickness over such topography. For example, in some cases a first portion of second insulator layer 130 may have a thickness within a first range while a second portion thereof has a thickness within a second, different range. In some cases, second insulator layer 130 may be formed from multiple layers of the same or different materials (e.g., an insulator material and a non-insulator material). Other suitable dimensions for second insulator layer 130 will depend on a given application and will be apparent in light of this disclosure.

Hardmask layer 135 can be formed from any suitable hardmask material (or combination of such materials), using any of a wide range of techniques. For example, in some cases, hardmask layer 135 may be formed from a metal, such as: tungsten (W); tantalum (Ta); titanium (Ti); ruthenium (Ru); and/or a combination of any one or more thereof. In some cases, hardmask layer 135 may be formed from a nitride, such as: titanium nitride (TiN); tantalum nitride (TaN); and/or a combination of any one or more thereof. In accordance with some embodiments, hardmask layer 135 may be formed using: a physical vapor deposition (PVD) process, such as sputter deposition; and/or an atomic layer deposition (ALD) process. Other suitable materials and techniques for forming hardmask layer 135 will depend on a given application and will be apparent in light of this disclosure.

Furthermore, the dimensions of hardmask layer 135 can be customized as desired for a given target application or end-use. For example, in some embodiments, hardmask layer 135 may have a thickness in the range of about 1-200 nm (e.g., about 1-50 nm, about 50-100 nm, about 100-150 nm, about 150-200 nm, or any other sub-range in the range of about 1-200 nm). In some instances, hardmask layer 135 may have a substantially uniform thickness over the topography provided, for example, by any underlying layers of IC 100 (e.g., second insulator layer 130). In some instances, hardmask layer 135 may be provided as a substantially conformal layer over such topography. In some other instances, hardmask layer 135 may be provided with a non-uniform or otherwise varying thickness over such topography. For example, in some cases a first portion of hardmask layer 135 may have a thickness within a first range while a second portion thereof has a thickness within a second, different range. Other suitable dimensions for hardmask layer 135 will depend on a given application and will be apparent in light of this disclosure.

The process may continue as in FIG. 2, which is a cross-sectional view of the IC 100 of FIG. 1 after patterning of hardmask layer 135, in accordance with an embodiment of the present disclosure. Patterning of hardmask layer 135 can be performed using any suitable standard and/or custom patterning process, as will be apparent in light of this disclosure. In accordance with some embodiments, hardmask layer 135 may be patterned, for example, using: a reactive-ion etching (RIE) process; and/or an ion milling process. Also, the etch chemistry utilized in patterning hardmask layer 135 can be customized, as desired for a given target application or end-use. In some cases, a dry plasma-based etch process may be utilized in anisotropically etching hardmask layer 135. After patterning, the resultant hardmask layer 135' may have a width/diameter ($D_2$) in the range of about 1-100 nm (e.g., about 1-25 nm, about 25-50 nm, about 50-75 nm, about 75-100 nm, or any other sub-range in the range of about 1-100 nm). In accordance with some embodiments, patterned hardmask layer 135' may provide a dot contact for underlying patterned free magnetic layer 125'. Other suitable techniques for patterning hardmask layer 135 will depend on a given application and will be apparent in light of this disclosure.

The process may continue as in FIG. 3, which is a cross-sectional view of the IC 100 of FIG. 2 after formation of a first spacer layer 140, in accordance with an embodiment of the present disclosure. First spacer layer 140 can be formed from any suitable dielectric material (or combination of such materials), using any of a wide range of techniques. For example, in some cases, first spacer layer 140 may be formed from: an oxide, such as silicon dioxide ($SiO_2$); a nitride, such as silicon nitride ($Si_3N_4$), titanium nitride (TiN), and/or silicon carbon nitride (SiCN); an oxynitride, such as silicon oxynitride ($SiO_xN_y$); and/or a combination of any one or more thereof. For example, in accordance with some embodiments, first spacer layer 140 may be formed using: a chemical vapor deposition (CVD) process; and/or an atomic layer deposition (ALD) process. Other suitable materials and techniques for forming first spacer layer 140 will depend on a given application and will be apparent in light of this disclosure.

Furthermore, the dimensions of first spacer layer 140 can be customized as desired for a given target application or end-use. In some instances, first spacer layer 140 may have a substantially uniform thickness over the topography provided, for example, by any underlying layers of IC 100 (e.g., patterned hardmask layer 135' and/or second insulator layer 130). In some instances, first spacer layer 140 may be provided as a substantially conformal layer over such topography. In some other instances, first spacer layer 140 may be provided with a non-uniform or otherwise varying thickness over such topography. For example, in some cases a first portion of first spacer layer 140 may have a thickness within a first range while a second portion thereof has a thickness within a second, different range. Other suitable dimensions for first spacer layer 140 will depend on a given application and will be apparent in light of this disclosure.

The process may continue as in FIG. 4, which is a cross-sectional view of the IC 100 of FIG. 3 after patterning first spacer layer 140, in accordance with an embodiment of the present disclosure. Patterning of first spacer layer 140 can be performed, in accordance with some embodiments, using any suitable standard and/or custom patterning process, as will be apparent in light of this disclosure. In accordance with some embodiments, first spacer layer 140 may be patterned, for example, using a reactive-ion etching (RIE) process. Also, the etch chemistry utilized in patterning first spacer layer 140 can be customized, as desired for a given target application or end-use. In some cases, a dry plasma-based etch process may be utilized in anisotropically etching first spacer layer 140. After patterning, the resultant first spacer layer 140' may have a generally cylindrical geometry that may be generally circular in cross-sectional profile, in some embodiments. In some other embodiments, first spacer layer 140' may have a generally cylindrical geometry that may be generally elliptical in cross-sectional profile. In some still other embodiments, first spacer layer 140' may have a generally tubular geometry that may be generally circular-annular or elliptical-annular in cross-sectional profile, in some embodiments. In some cases, first spacer layer 140' may have a sidewall thickness ($D_3$) in the range of about 1-20 nm (e.g., about 1-5 nm, about 5-10 nm, about 10-15 nm, about 15-20 nm, or any other sub-range in the range of about 1-20 nm). Other suitable techniques for patterning first spacer layer 140 will depend on a given application and will be apparent in light of this disclosure.

The process may continue as in FIG. 5, which is a cross-sectional view of the IC 100 of FIG. 4 after patterning second insulator layer 130, free magnetic layer 125, and first insulator layer 120, in accordance with an embodiment of the present disclosure. Patterning of second insulator layer 130, free magnetic layer 125, and first insulator layer 120 can be performed, in accordance with some embodiments, using any suitable standard and/or custom patterning process, as will be apparent in light of this disclosure. In accordance with some embodiments, second insulator layer 130, free magnetic layer 125, and first insulator layer 120 may be patterned, for example, using: a reactive-ion etching (RIE) process; and/or an ion milling process. Also, the etch chemistry utilized in patterning second insulator layer 130, free magnetic layer 125, and first insulator layer 120 can be customized, as desired for a given target application or end-use. In some cases, a dry plasma-based etch process may be utilized in anisotropically etching second insulator layer 130, free magnetic layer 125, and first insulator layer 120.

After patterning, the resultant second insulator layer 130', free magnetic layer 125', and first insulator layer 120' may have a generally cylindrical geometry that may be generally circular in cross-sectional profile, in some embodiments. In some other embodiments, second insulator layer 130', free magnetic layer 125', and first insulator layer 120' may have a generally cylindrical geometry that may be generally elliptical in cross-sectional profile. In some instances, patterning (e.g., etching) of free magnetic layer 125 may stop above an upper surface of the underlying first insulator layer 120. In some other instances, however, patterning (e.g., etching) of free magnetic layer 125 may stop below a lower surface of the underlying first insulator layer 120. In some cases, second insulator layer 130', free magnetic layer 125', and first insulator layer 120' may have a width/diameter ($D_4$) in the range of about 1-100 nm (e.g., about 1-25 nm, about 25-50 nm, about 50-75 nm, about 75-100 nm, or any other sub-range in the range of about 1-100 nm). As will be appreciated in light of this disclosure, the width/diameter ($D_4$) of second insulator layer 130', free magnetic layer 125', and first insulator layer 120' may depend, at least in part, on the sidewall thickness ($D_3$) of patterned first spacer layer 140', discussed above. Thus, in a general sense, patterned first spacer layer 140' may serve, at least in part, to ensure that patterned hardmask layer 135' is substantially center-aligned (e.g., exactly center-aligned or otherwise within a given tolerance) with respect to second insulator layer 130', free magnetic layer 125', and first insulator layer 120', in accordance with an embodiment. Other suitable techniques for patterning second insulator layer 130, free magnetic layer 125, and first insulator layer 120 will depend on a given application and will be apparent in light of this disclosure.

As previously noted, FIGS. 6A-6B illustrate additional processing of the IC 100 of FIG. 5 to provide an IC 101, in accordance with an embodiment of the present disclosure. Thus, in some cases, the process may continue as in FIG. 6A, which is a cross-sectional view of the IC 100 of FIG. 5 after patterning fixed magnetic layer 105, in accordance with an embodiment of the present disclosure. As will be appreciated in light of this disclosure, patterning of fixed magnetic layer 105 may be performed using any of the example techniques discussed above, for instance, with respect to free magnetic layer 125. After patterning, the resultant fixed magnetic layer 105' may have a generally cylindrical geometry that may be generally circular in cross-sectional profile, in some embodiments. In some other embodiments, fixed magnetic layer 105' may have a generally cylindrical geometry that may be generally elliptical in cross-sectional profile. In some cases, patterned fixed magnetic layer 105' may have a width/diameter ($D_4$) in the range of about 1-100 nm (e.g., about 1-25 nm, about 25-50 nm, about 50-75 nm, about 75-100 nm, or any other sub-range in the range of about 1-100 nm). As will be appreciated in light of this disclosure, the width/diameter ($D_4$) of fixed magnetic layer 105' may depend, at least in part, on the sidewall thickness ($D_3$) of patterned first spacer layer 140', discussed above. Thus, and in accordance with some embodiments, patterned first spacer layer 140' may be utilized in patterning (e.g., etching) the fixed magnetic layer 105 of the MTJ device of IC 101. Also, in a general sense, patterned first spacer layer 140' may serve, at least in part, to ensure that patterned hardmask layer 135' is substantially center-aligned (e.g., exactly center-aligned or otherwise within a given tolerance) with respect to patterned fixed magnetic layer 105', in accordance with an embodiment.

The process may continue as in FIG. 6B, which is a cross-sectional view of the IC 101 of FIG. 6A after formation of an encapsulation layer 150 and upper interconnect 155, in accordance with an embodiment of the present disclosure. Encapsulation layer 150 can be formed from any suitable material (or combination of materials), using any of a wide range of techniques. For example, in some cases, encapsulation layer 150 may be formed from: an oxide, such as aluminum oxide ($Al_2O_3$) and/or tantalum oxide ($Ta_2O_5$); a nitride, such as silicon nitride ($Si_3N_4$), titanium nitride (TiN), and/or silicon carbon nitride (SiCN); and/or a combination of any one or more thereof. In accordance with some embodiments, encapsulation layer 150 may be formed using: a chemical vapor deposition (CVD) process; and/or an atomic layer deposition (ALD) process. Other suitable materials and techniques for forming encapsulation layer 150 will depend on a given application and will be apparent in light of this disclosure.

Furthermore, the dimensions of encapsulation layer 150 of IC 101 can be customized as desired for a given target application or end-use. In some instances, encapsulation layer 150 may have a substantially uniform thickness over the topography provided, for example, by any underlying layers of IC 101 (e.g., patterned hardmask layer 135', patterned first spacer layer 140', patterned second insulator layer 130', patterned free magnetic layer 125', patterned first insulator layer 120', patterned fixed magnetic layer 105', and/or metallized circuit layer 110). In some instances, encapsulation layer 150 may be provided as a substantially conformal layer over such topography. In some other instances, encapsulation layer 150 may be provided with a non-uniform or otherwise varying thickness over such topography. For example, in some cases a first portion of encapsulation layer 150 may have a thickness within a first range while a second portion thereof has a thickness within a second, different range. Other suitable dimensions for encapsulation layer 150 of IC 101 will depend on a given application and will be apparent in light of this disclosure.

As will be appreciated in light of this disclosure, upper interconnect 155 can be formed from any of the example electrically conductive materials discussed above, for instance, with respect to lower interconnect 115, in accordance with some embodiments. Also, as will be appreciated, upper interconnect 155 can be formed over IC 101 using any of the example formation techniques discussed above with reference to lower interconnect 115, in accordance with some embodiments. As will be appreciated further, the dimensions of upper interconnect 155 can be customized, as desired for a given target application or end-use. For example, in some embodiments, upper interconnect 155 may have a width/diameter ($D_5$) in the range of about 0.1-100 nm (e.g., about 0.1-1 nm, about 1-25 nm, about 25-50 nm, about 50-75 nm, about 75-100 nm, or any other sub-range in the range of about 0.1-100 nm). In some instances, upper interconnect 155 may have a width/diameter ($D_6$) that is substantially equivalent to (e.g., exactly equal to or otherwise within a given tolerance of) the width/diameter ($D_1$) of lower interconnect 115. In some cases, the width/diameter ($D_5$) of upper interconnect 155 may be less than or about equal to the width/diameter ($D_2$) of patterned hardmask layer 135'. In some other cases, the width/diameter ($D_5$) of upper interconnect 155 may be greater than the width/diameter ($D_2$) of patterned hardmask layer 135'. Other suitable materials, configurations, and techniques for forming upper interconnect 155 will depend on a given application and will be apparent in light of this disclosure.

As previously noted, FIGS. 7A-7D illustrate additional processing of the IC 100 of FIG. 5 to provide an IC 102, in accordance with another embodiment of the present disclosure. Thus, in some cases, the process may continue as in FIG. 7A, which is a cross-sectional view of the IC 100 of FIG. 5 after formation of an optional second spacer layer 145, in accordance with an embodiment of the present disclosure. As will be appreciated in light of this disclosure, second spacer layer 145 can be formed from any of the example dielectric materials discussed above, for instance, with respect to first spacer layer 140, in accordance with some embodiments. Also, as will be appreciated, second spacer layer 145 can be formed over IC 102 using any of the example formation techniques discussed above with reference to first spacer layer 140, in accordance with some embodiments. Other suitable materials and techniques for forming optional second spacer layer 145 will depend on a given application and will be apparent in light of this disclosure.

Furthermore, the dimensions of second spacer layer 145 can be customized as desired for a given target application or end-use. In some instances, second spacer layer 145 may have a substantially uniform thickness over the topography provided, for example, by any underlying layers of IC 102 (e.g., patterned hardmask layer 135', patterned first spacer layer 140', patterned second insulator layer 130', patterned free magnetic layer 125', patterned first insulator layer 120', and/or fixed magnetic layer 105). In some instances, second spacer layer 145 may be provided as a substantially conformal layer over such topography. In some other instances, second spacer layer 145 may be provided with a non-uniform or otherwise varying thickness over such topography. For example, in some cases a first portion of second spacer layer 145 may have a thickness within a first range while a second portion thereof has a thickness within a second, different range. Other suitable dimensions for second spacer layer 145 will depend on a given application and will be apparent in light of this disclosure.

Figure 7A:
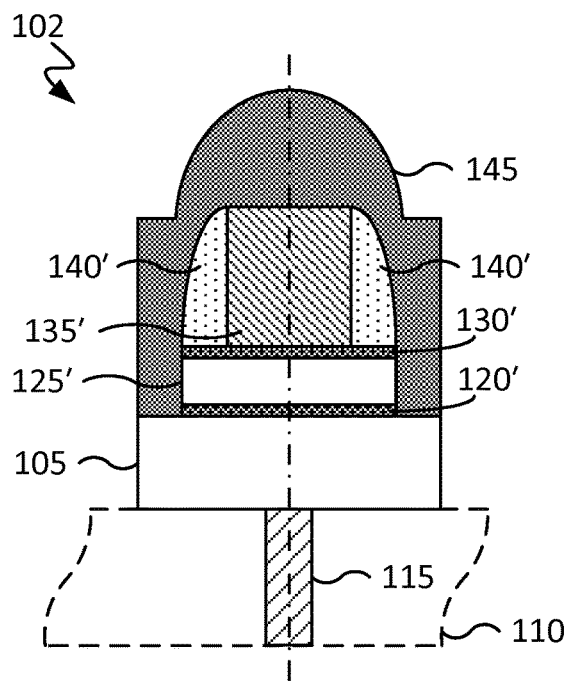
FIG. 7A is a cross-sectional view of the IC of FIG. 5 after formation of an optional second spacer layer, in accordance with another embodiment of the present disclosure.
Figure 7B:
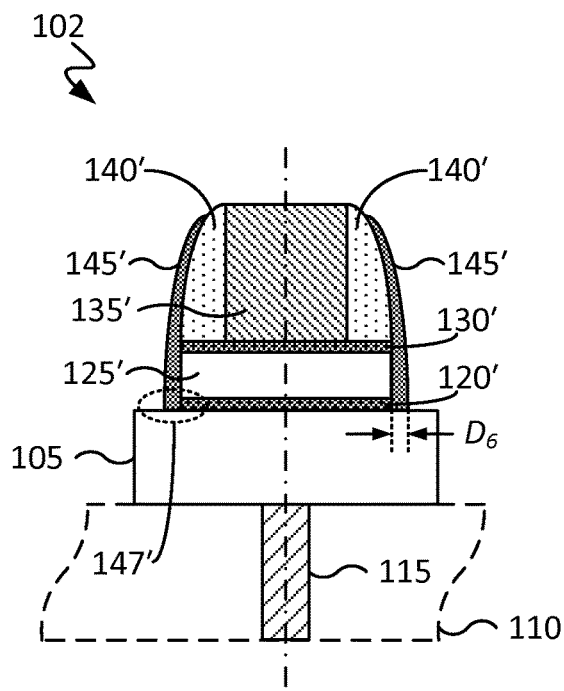
FIG. 7B is a cross-sectional view of the IC of FIG. 7A after patterning the second spacer layer, in accordance with an embodiment of the present disclosure.

The process may continue as in FIG. 7B, which is a cross-sectional view of the IC 102 of FIG. 7A after patterning second spacer layer 145, in accordance with an embodiment of the present disclosure. As will be appreciated in light of this disclosure, second spacer layer 145 can be patterned using any of the example patterning techniques and etch chemistries discussed above with reference to first spacer layer 140, in accordance with some embodiments. After patterning, the resultant second spacer layer 145' may have a generally cylindrical geometry that may be generally circular in cross-sectional profile, in some embodiments. In some other embodiments, second spacer layer 145' may have a generally cylindrical geometry that may be generally elliptical in cross-sectional profile. In some still other embodiments, second spacer layer 145' may have a generally tubular geometry that may be generally circular-annular or elliptical-annular in cross-sectional profile, in some embodiments. In some cases, second spacer layer 145' may have a sidewall thickness ($D_6$) in the range of about 1-20 nm (e.g., about 1-5 nm, about 5-10 nm, about 10-15 nm, about 15-20 nm, or any other sub-range in the range of about 1-20 nm). Other suitable techniques for patterning second spacer layer 145 will depend on a given application and will be apparent in light of this disclosure.

As generally shown in the dotted ellipse in FIG. 7B, a lower portion 147' (e.g., the foot or base portion) of patterned second spacer layer 145' may land at a location along the sidewalls of the MTJ device of IC 102 that is below patterned first insulator layer 120' and above fixed magnetic layer 105, in accordance with some embodiments. It should be noted, however, that the present disclosure is not so limited. For instance, in accordance with some other embodiments, a lower portion 147' of patterned second spacer layer 145' may land at a location along the sidewalls of the MTJ device of IC 102 that is below patterned free magnetic layer 125' and above patterned first insulator layer 120'. In a more general sense, a lower portion 147' of patterned second spacer layer 145' may land at any location along the sidewalls of the MTJ device of IC 102 that does not expose patterned free magnetic layer 125' to redepositing of etch byproducts during patterning of fixed magnetic layer 105, as discussed below.

Figure 7C:
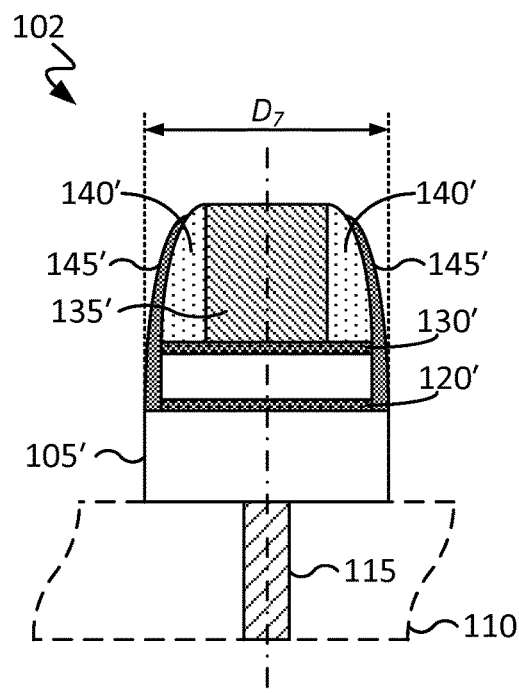
FIG. 7C is a cross-sectional view of the IC of FIG. 7B after patterning the fixed magnetic layer, in accordance with an embodiment of the present disclosure.

The process may continue as in FIG. 7C, which is a cross-sectional view of the IC 102 of FIG. 7B after patterning fixed magnetic layer 105, in accordance with an embodiment of the present disclosure. After patterning second spacer layer 145 (e.g., to form patterned second spacer layer 145'), underlying fixed magnetic layer 105 may undergo patterning. In accordance with some embodiments, patterned second spacer layer 145' may serve, at least in part, to protect the sidewalls of patterned free magnetic layer 125' (and/or other layers of the MTJ of IC 102) from redepositing of residual etch byproducts during patterning of fixed magnetic layer 105. Thus, and in accordance with some embodiments, patterned second spacer layer 145' may be configured to prevent or otherwise reduce any susceptibility to electrical shorting between the patterned free magnetic layer 125' and the patterned fixed magnetic layer 105' of the MTJ of IC 102. In some cases, patterned fixed magnetic layer 105' may have a width/diameter ($D_7$) in the range of about 1-100 nm (e.g., about 1-25 nm, about 25-50 nm, about 50-75 nm, about 75-100 nm, or any other sub-range in the range of about 1-100 nm). As will be appreciated in light of this disclosure, the width/diameter ($D_7$) of fixed magnetic layer 105' may depend, at least in part, on the sidewall thickness ($D_6$) of patterned second spacer layer 145', discussed above. Thus, and in accordance with some embodiments, patterned second spacer layer 145' may be utilized in patterning (e.g., etching) the fixed magnetic layer 105 of the MTJ device of IC 102. In a more general sense, and in accordance with some embodiments, the dual spacer combination of patterned second spacer layer 145' and patterned first spacer layer 140' may be utilized in patterning the fixed magnetic layer 105 of the MTJ device of IC 102.

Figure 7D:
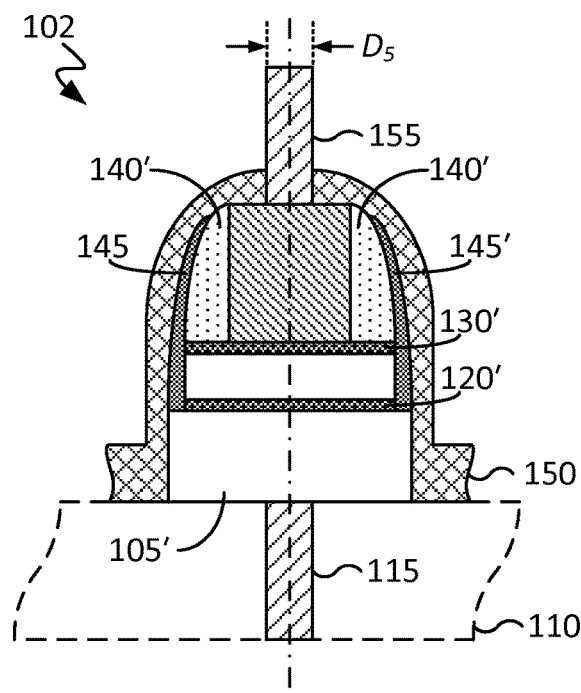
FIG. 7D is a cross-sectional view of the IC of FIG. 7C after formation of an encapsulation layer and upper interconnect, in accordance with an embodiment of the present disclosure.

The process may continue as in FIG. 7D, which is a cross-sectional view of the IC 102 of FIG. 7C after formation of an encapsulation layer 150 and upper interconnect 155, in accordance with an embodiment of the present disclosure. The dimensions of encapsulation layer 150 of IC 102 can be customized as desired for a given target application or end-use. In some instances, encapsulation layer 150 may have a substantially uniform thickness over the topography provided, for example, by any underlying layers of IC 102 (e.g., patterned hardmask layer 135', patterned first spacer layer 140', patterned second spacer layer 145', patterned fixed magnetic layer 105', and/or metallized circuit layer 110). In some instances, encapsulation layer 150 may be provided as a substantially conformal layer over such topography. In some other instances, encapsulation layer 150 may be provided with a non-uniform or otherwise varying thickness over such topography. For example, in some cases a first portion of encapsulation layer 150 may have a thickness within a first range while a second portion thereof has a thickness within a second, different range. Other suitable dimensions for encapsulation layer 150 of IC 102 will depend on a given application and will be apparent in light of this disclosure.

Example System

Figure 8:
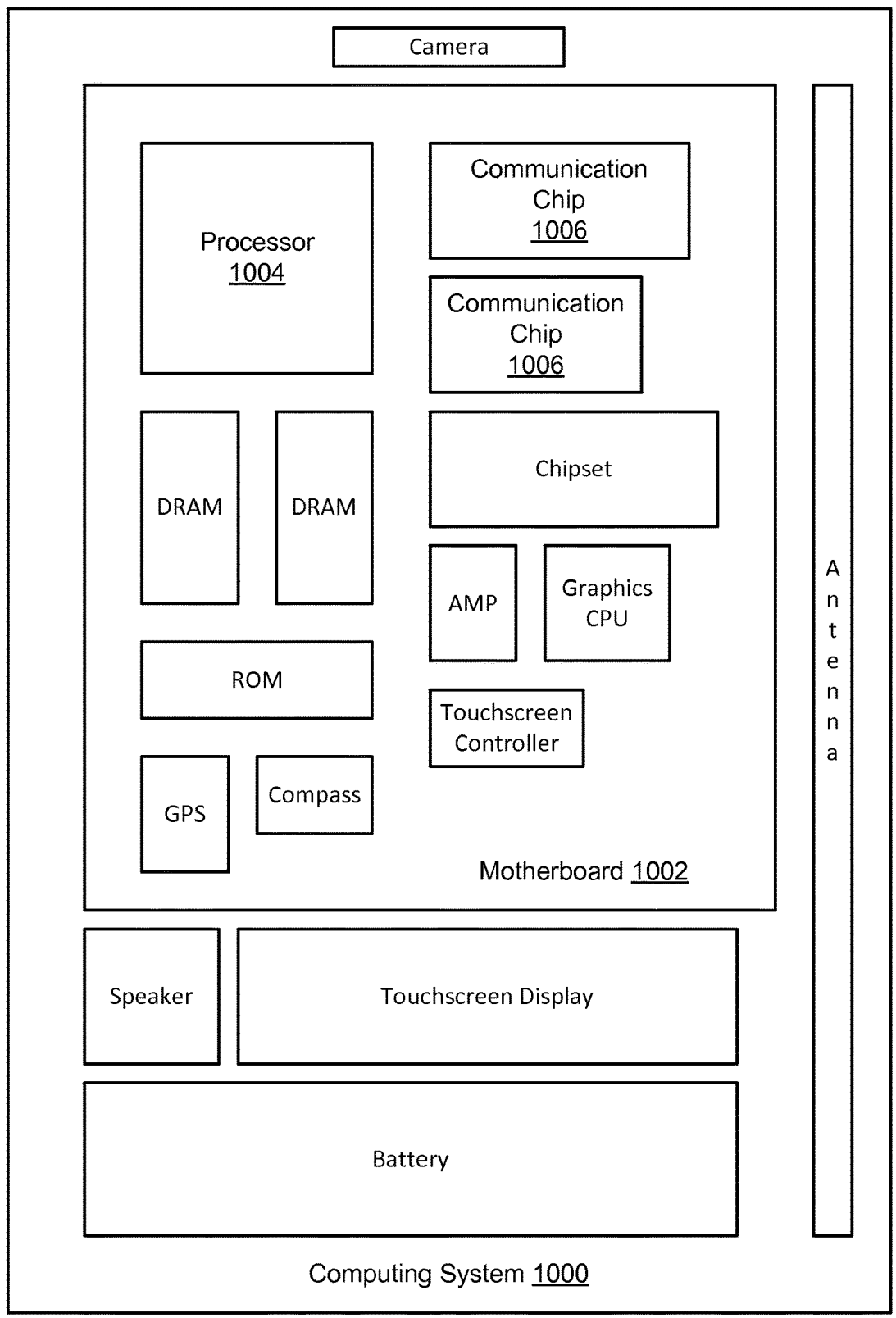
FIG. 8 illustrates a computing system implemented with integrated circuit structures or devices formed using the disclosed techniques in accordance with an example embodiment.

FIG. 8 illustrates a computing system 1000 implemented with integrated circuit structures or devices formed using the disclosed techniques in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

FURTHER EXAMPLE EMBODIMENTS

The following examples pertain to further embodiments, from which numerous permutations and configurations will be apparent.

Example 1 is an integrated circuit including: a fixed magnetic layer; a first insulator layer formed over the fixed magnetic layer; a free magnetic layer formed over the first insulator layer; a second insulator layer formed over the free magnetic layer; an electrically conductive hardmask layer formed over the second insulator layer, wherein the hardmask layer has a width/diameter that is less than a width/diameter of the free magnetic layer; and a first dielectric spacer formed over the second insulator layer and covering sidewalls of the hardmask layer.

Example 2 includes the subject matter of any of Examples 1 and 3-34, wherein the fixed magnetic layer comprises at least one of iron (Fe), tantalum (Ta), ruthenium (Ru), cobalt (Co), cobalt-palladium (Co—Pd), cobalt-platinum (Co—Pt), cobalt-iron-boron (CoFeB), and/or a combination of any one or more thereof.

Example 3 includes the subject matter of any of Examples 1-2 and 4-34, wherein the fixed magnetic layer has a thickness in the range of about 1-100 Å.

Example 4 includes the subject matter of any of Examples 1-3 and 5-34, wherein the fixed magnetic layer has a width/diameter in the range of about 1-100 nm.

Example 5 includes the subject matter of any of Examples 1-4 and 6-34, wherein the fixed magnetic layer is electronically coupled with an underlying interconnect.

Example 6 includes the subject matter of any of Examples 1-5 and 7-34, wherein the free magnetic layer comprises at least one of cobalt-iron-boron (CoFeB) and/or tantalum (Ta).

Example 7 includes the subject matter of any of Examples 1-6 and 8-34, wherein the free magnetic layer has a thickness in the range of about 1-100 Å.

Example 8 includes the subject matter of any of Examples 1-7 and 9-34, wherein the free magnetic layer has a width/diameter in the range of about 1-100 nm.

Example 9 includes the subject matter of any of Examples 1-8 and 10-34, wherein the free magnetic layer is electronically coupled with an overlying interconnect.

Example 10 includes the subject matter of any of Examples 1-9 and 11-34, wherein the first insulator layer comprises magnesium oxide (MgO).

Example 11 includes the subject matter of any of Examples 1-10 and 12-34, wherein the first insulator layer has a thickness in the range of about 1-100 Å.

Example 12 includes the subject matter of any of Examples 1-11 and 13-34, wherein the first insulator layer has a width/diameter in the range of about 1-100 nm.

Example 13 includes the subject matter of any of Examples 1-12 and 14-34, wherein the second insulator layer comprises at least one of magnesium oxide (MgO), tantalum oxide ($Ta_2O_5$), aluminum oxide ($Al_2O_3$), and/or a combination of any one or more thereof.

Example 14 includes the subject matter of any of Examples 1-13 and 15-34, wherein the second insulator layer has a thickness in the range of about 1-100 Å.

Example 15 includes the subject matter of any of Examples 1-14 and 16-34, wherein the second insulator layer has a width/diameter in the range of about 1-100 nm.

Example 16 includes the subject matter of any of Examples 1-15 and 17-34, wherein the hardmask layer comprises at least one of tungsten (W), tantalum (Ta), titanium (Ti), ruthenium (Ru), titanium nitride (TiN), tantalum nitride (TaN), and/or a combination of any one or more thereof.

Example 17 includes the subject matter of any of Examples 1-16 and 18-34, wherein the hardmask layer has a thickness in the range of about 1-200 nm.

Example 18 includes the subject matter of any of Examples 1-17 and 19-34, wherein the hardmask layer has a width/diameter in the range of about 1-100 nm.

Example 19 includes the subject matter of any of Examples 1-18 and 20-34, wherein the hardmask layer is center-aligned with respect to the free magnetic layer.

Example 20 includes the subject matter of any of Examples 1-19 and 21-34, wherein the first dielectric spacer comprises at least one of silicon dioxide ($SiO_2$), silicon nitride ($Si_3N_4$), titanium nitride (TiN), silicon carbon nitride (SiCN), silicon oxynitride ($SiO_xN_y$), and/or a combination of any one or more thereof.

Example 21 includes the subject matter of any of Examples 1-20 and 22-34, wherein the first dielectric spacer has a sidewall thickness in the range of about 1-20 nm.

Example 22 includes the subject matter of any of Examples 1-21 and 23-34, wherein the first dielectric spacer has a cylindrical geometry that is circular or elliptical in cross-sectional profile.

Example 23 includes the subject matter of any of Examples 1-22 and 24-34 and further includes an encapsulation layer formed over a topography provided by the hardmask layer, the first dielectric spacer, the second insulator layer, the free magnetic layer, the first insulator layer, and the fixed magnetic layer.

Example 24 includes the subject matter of any of Examples 1-23 and 25-34 and further includes a second dielectric spacer formed over the fixed magnetic layer and covering sidewalls of the free magnetic layer.

Example 25 includes the subject matter of Example 24, wherein a lower portion of the second dielectric spacer resides below sidewalls of the first insulator layer and above sidewalls of the fixed magnetic layer.

Example 26 includes the subject matter of Example 24, wherein a lower portion of the second dielectric spacer resides below sidewalls of the free magnetic layer and above sidewalls of the first insulator layer.

Example 27 includes the subject matter of Example 24, wherein the second dielectric spacer comprises at least one of silicon dioxide ($SiO_2$), silicon nitride ($Si_3N_4$), titanium nitride (TiN), silicon carbon nitride (SiCN), silicon oxynitride ($SiO_xN_y$), and/or a combination of any one or more thereof.

Example 28 includes the subject matter of Example 24, wherein the second dielectric spacer and the first dielectric spacer are of different material compositions.

Example 29 includes the subject matter of Example 24, wherein the second dielectric spacer has a sidewall thickness in the range of about 1-20 nm.

Example 30 includes the subject matter of Example 24, wherein the second dielectric spacer has a cylindrical geometry that is circular or elliptical in cross-sectional profile.

Example 31 includes the subject matter of Example 24, wherein the second dielectric spacer is configured to prevent electrical shorting between the free magnetic layer and the fixed magnetic layer.

Example 32 includes the subject matter of Example 24 and further includes an encapsulation layer formed over a topography provided by the hardmask layer, the first dielectric spacer, the second dielectric spacer, and the fixed magnetic layer.

Example 33 is an embedded memory device including the integrated circuit of any of Examples 1-32.

Example 34 includes the subject matter of Example 33, wherein the embedded memory device is a spin-torque transfer memory (STTM) device.

Example 35 is a method of forming an integrated circuit, the method including: forming a magnetic tunnel junction (MTJ) comprising a fixed magnetic layer, a first insulator layer over the fixed magnetic layer, and a free magnetic layer over the first insulator layer; forming a second insulator layer over the free magnetic layer; forming an electrically conductive hardmask layer over the second insulator layer; and forming a first dielectric spacer over the second insulator layer and covering sidewalls of the hardmask layer.

Example 36 includes the subject matter of any of Examples 35 and 37-51 and further includes: patterning the fixed magnetic layer to reduce its width/diameter to about equal to a width/diameter of the free magnetic layer.

Example 37 includes the subject matter of any of Examples 35-36 and 38-51, wherein forming the hardmask layer includes: depositing the hardmask layer over a topography provided by the second insulator layer; and patterning the hardmask layer to reduce its width/diameter to less than or about equal to a width/diameter of the second insulator layer.

Example 38 includes the subject matter of Example 37, wherein depositing the hardmask layer involves at least one of a physical vapor deposition (PVD) process and/or an atomic layer deposition (ALD) process.

Example 39 includes the subject matter of Example 37, wherein patterning the hardmask layer involves at least one of a reactive-ion etching (ME) process and/or an ion milling process.

Example 40 includes the subject matter of any of Examples 35-39 and 41-51, wherein forming the first dielectric spacer includes: depositing the first dielectric spacer over a topography provided by the hardmask layer and the second insulator layer; and patterning the first dielectric spacer to reduce its dimensions to cover sidewalls of the hardmask layer.

Example 41 includes the subject matter of Example 40, wherein depositing the first dielectric spacer involves at least one of a chemical vapor deposition (CVD) process and/or an atomic layer deposition (ALD) process.

Example 42 includes the subject matter of Example 40, wherein patterning the first dielectric spacer involves a reactive-ion etching (ME) process.

Example 43 includes the subject matter of any of Examples 35-42 and 44-51 and further includes: forming an encapsulation layer over a topography provided by the hardmask layer, the first dielectric spacer, the second insulator layer, the free magnetic layer, the first insulator layer, and the fixed magnetic layer.

Example 44 includes the subject matter of any of Examples 35-43 and 45-51 and further includes: forming a second dielectric spacer over the fixed magnetic layer and covering sidewalls of the free magnetic layer.

Example 45 includes the subject matter of Example 44, wherein forming the second dielectric spacer includes: depositing the second dielectric spacer over a topography provided by the hardmask layer, the first dielectric spacer, the second insulator layer, and the free magnetic layer; and patterning the second dielectric spacer such that a lower portion of the second dielectric spacer resides either: below sidewalls of the free magnetic layer and above sidewalls of the first insulator layer; or below sidewalls of the first insulator layer and above sidewalls of the fixed magnetic layer.

Example 46 includes the subject matter of Example 45, wherein depositing the second dielectric spacer involves at least one of a chemical vapor deposition (CVD) process and/or an atomic layer deposition (ALD) process.

Example 47 includes the subject matter of Example 45, wherein pattering the second dielectric spacer involves a reactive-ion etching (RIE) process.

Example 48 includes the subject matter of any of Examples 35-47 and 49-51 and further includes: patterning the fixed magnetic layer to reduce its width/diameter to greater than a width/diameter of the free magnetic layer.

Example 49 includes the subject matter of any of Examples 35-48 and 50-51 and further includes: forming an encapsulation layer over a topography provided by the hardmask layer, the first dielectric spacer, the second dielectric spacer, and the fixed magnetic layer.

Example 50 is an embedded memory device formed using the method including the subject matter of any of Examples 35-49 and 51.

Example 51 includes the subject matter of Example 50, wherein the embedded memory device is a spin-torque transfer memory (STTM) device.

Example 52 is a spin-torque transfer memory (STTM) device including: a fixed magnetic layer; a first magnesium oxide (MgO) layer formed over the fixed magnetic layer; and a free magnetic layer formed over the first insulator layer; a second magnesium oxide (MgO) layer formed over the free magnetic layer; a metal-based hardmask layer formed over the second insulator layer, wherein the metal-based hardmask layer has a width/diameter that is less than a width/diameter of the free magnetic layer and is in the range of about 1-100 nm, and wherein the metal-based hardmask layer is electronically coupled with the free magnetic layer; and a first dielectric spacer formed over the second insulator layer and covering sidewalls of the metal-based hardmask layer, wherein the first dielectric spacer has a sidewall thickness in the range of about 1-20 nm.

Example 53 includes the subject matter of any of Examples 52 and 54-61, wherein the fixed magnetic layer comprises at least one of iron (Fe), tantalum (Ta), ruthenium (Ru), cobalt (Co), cobalt-palladium (Co—Pd), cobalt-platinum (Co—Pt), cobalt-iron-boron (CoFeB), and/or a combination of any one or more thereof.

Example 54 includes the subject matter of any of Examples 52-53 and 55-61, wherein the free magnetic layer comprises at least one of cobalt-iron-boron (CoFeB) and/or tantalum (Ta).

Example 55 includes the subject matter of any of Examples 52-54 and 56-61, wherein the metal-based hardmask layer comprises at least one of tungsten (W), tantalum (Ta), titanium (Ti), ruthenium (Ru), titanium nitride (TiN), tantalum nitride (TaN), and/or a combination of any one or more thereof.

Example 56 includes the subject matter of any of Examples 52-55 and 57-61, wherein the first dielectric spacer comprises at least one of silicon dioxide ($SiO_2$), silicon nitride ($Si_3N_4$), titanium nitride (TiN), silicon carbon nitride (SiCN), silicon oxynitride ($SiO_xN_y$), and/or a combination of any one or more thereof.

Example 57 includes the subject matter of any of Examples 52-56 and 58-61 and further includes a second dielectric spacer formed over the fixed magnetic layer and covering sidewalls of the free magnetic layer, wherein the second dielectric spacer has a sidewall thickness in the range of about 1-20 nm.

Example 58 includes the subject matter of Example 57, wherein a lower portion of the second dielectric spacer resides either: below sidewalls of the free magnetic layer and above sidewalls of the first insulator layer; or below sidewalls of the first insulator layer and above sidewalls of the fixed magnetic layer.

Example 59 includes the subject matter of Example 57, wherein the second dielectric spacer comprises at least one of silicon dioxide ($SiO_2$), silicon nitride ($Si_3N_4$), titanium nitride (TiN), silicon carbon nitride (SiCN), silicon oxynitride (SiO$_x$N$_y$), and/or a combination of any one or more thereof.

Example 60 includes the subject matter of any of Examples 52-59 and 61 and further includes: a lower electrode electronically coupled to the fixed magnetic layer; and an upper electrode electronically coupled to the free magnetic layer.

Example 61 is an embedded memory device including the STTM device of any of Examples 52-60.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future-filed applications claiming priority to this application may claim the disclosed subject matter in a different manner and generally may include any set of one or more limitations as variously disclosed or otherwise demonstrated herein.

What is claimed is:

1. An integrated circuit comprising:
   a first layer including one or more magnetic materials;
   a second layer including one or more conductive materials, the second layer having a first width;
   a third layer between the first and second layers, the third layer including one or more magnetic materials;
   a fourth layer between the first and third layers, the fourth layer including one or more insulator materials;
   a fifth layer between the third and second layers, the fifth layer including one or more insulator materials;
   a spacer around the second layer, the spacer including one or more dielectric materials;
   a sixth layer in contact with sidewalls of at least the spacer and the first layer, the sixth layer conformal to the underlying first layer, second layer, and spacer, the sixth layer in contact with top surfaces of the spacer and the second layer;
   an interconnect in contact with the second layer, the interconnect having a second width less than the first width; and
   wherein the sidewalls of the spacer and respective sidewalls of the fifth layer are aligned with one another.

2. The integrated circuit of claim 1, wherein the one or more magnetic materials included in the first layer and the third layer includes one or more of iron, tantalum, ruthenium, cobalt, platinum, palladium, or boron.

3. The integrated circuit of claim 1, wherein the one or more magnetic materials included in the first layer and the third layer includes one or more transition metals, one or more metalloids, or a combination of one or more transition metals and one or more metalloids.

4. The integrated circuit of claim 1, wherein the one or more conductive materials included in the second layer includes one or more of tungsten, tantalum, titanium, or ruthenium.

5. The integrated circuit of claim 1, wherein the one or more conductive materials included in the second layer includes nitrogen and one or more metals.

6. The integrated circuit of claim 1, wherein the one or more insulator materials included in the fourth and fifth layers includes oxygen and one or more metals wherein the one or more metals includes magnesium.

7. The integrated circuit of claim 1, wherein the one or more dielectric materials included in the spacer includes one or more of oxygen, nitrogen, carbon, and silicon.

8. The integrated circuit of claim 1, wherein the sidewalls of the spacer are also aligned with respective sidewalls of the first layer and the third layer.

9. The integrated circuit of claim 1, wherein the spacer has a cylindrical geometry that is circular or elliptical in a cross-sectional profile.

10. The integrated circuit of claim 1, further comprising an additional spacer that is both (1) laterally between the sixth layer and part of the spacer and (2) laterally between the sixth layer and the third layer, the additional spacer including one or more dielectric materials, wherein the additional spacer is in contact with sidewalls of the spacer, the third layer, and the fifth layer, and wherein sidewalls of the additional spacer and respective sidewalls of the first layer are aligned with one another.

11. The integrated circuit of claim 1, wherein at least the first, third, and fourth layers are part of an embedded memory device.

12. The integrated circuit of claim 1, wherein the sixth layer comprises oxygen and one of tantalum or aluminum.

13. The integrated circuit of claim 1, wherein the sixth layer is conformal to the underlying spacers.

14. The integrated circuit of claim 1, wherein the interconnect is a first interconnect, the integrated circuit further comprising a second interconnect in contact with the first layer.

15. The integrated circuit of claim 14, wherein the second interconnect is coaxial with the first interconnect.

16. The integrated circuit of claim 1, wherein the sixth layer comprises nitrogen and one of silicon or titanium.

17. An integrated circuit comprising:
    a first layer including one or more magnetic materials;
    a second layer including one or more conductive materials, the second layer having a second layer width;
    a third layer between the first and second layers, the third layer including one or more magnetic materials;
    a fourth layer between the first and third layers, the fourth layer including one or more insulator materials;
    a fifth layer between the third and second layers, the fifth layer including one or more insulator materials;
    a spacer around the second layer, the spacer including one or more dielectric materials;
    a sixth layer in contact with sidewalls of at least the spacer and the first layer, the sixth layer conformal to at least part of the (1) underlying first layer, (2) second layer, and (3) spacer, the sixth layer being at least in contact with top surfaces of the spacer and the second layer;
    a first interconnect in contact with the second layer, the first interconnect having a first interconnect width less than the second layer width;
    a second interconnect in contact with the first layer, the second interconnect coaxial with the first interconnect;
    wherein sidewalls of the spacer and respective sidewalls of the fifth layer are aligned with one another; and
    wherein a top surface of the second layer is coplanar with a top surface of the spacer.

18. The integrated circuit of claim 17, further comprising an additional spacer that is both (1) laterally between the sixth layer and part of the spacer and (2) laterally between the sixth layer and the third layer, the additional spacer including one or more dielectric materials, wherein the additional spacer is in contact with sidewalls of the spacer, the third layer, and the fifth layer, and wherein sidewalls of the additional spacer and respective sidewalls of the first layer are aligned with one another and wherein the sixth layer is in contact with the sidewalls of the additional spacer and in contact with a portion of the sidewalls of the spacer.

19. An integrated circuit including a spin-torque transfer memory (STTM) device, the integrated circuit comprising:
   a fixed magnetic layer;
   a conductive structure having a first width;
   a free magnetic layer between the fixed magnetic layer and the conductive structure;
   a first insulator layer between fixed magnetic layer and the free magnetic layer;
   a second insulator layer between the free magnetic layer and the conductive structure; a dielectric spacer around the conductive structure, wherein sidewalls of the dielectric spacer and respective sidewalls of the free magnetic layer are aligned with one another;
   an interconnect in contact with the conductive structure, the interconnect having second width less than the first width; and
   a conformal layer in contact with sidewalls of the fixed magnetic layer, the free magnetic layer, the first insulator layer, the second insulator layer, and the dielectric spacer, the conformal layer conformal to the underlying conductive structure, free magnetic layer, first insulation layer, second insulation layer, and dielectric spacer, the conformal layer in contact with top surfaces of the dielectric spacer and the conductive structure.

20. The integrated circuit of claim 19, wherein the conformal layer is in contact with a metallized circuit layer under the fixed magnetic layer.

* * * * *